United States Patent [19]
Johnson

[11] Patent Number: 5,486,770
[45] Date of Patent: Jan. 23, 1996

[54] HIGH FREQUENCY WAFER PROBE APPARATUS AND METHOD

[75] Inventor: Scott V. Johnson, Scottsdale, Ariz.

[73] Assignee: Motorola, Inc., Schaumburg, Ill.

[21] Appl. No.: 265,876

[22] Filed: Jun. 27, 1994

[51] Int. Cl.⁶ .................................................. G01R 31/00
[52] U.S. Cl. .......................... 324/754; 324/762; 439/578
[58] Field of Search ............................ 439/578; 324/754, 324/762

[56] References Cited

U.S. PATENT DOCUMENTS

| | | | |
|---|---|---|---|
| 3,731,191 | 5/1973 | Bullard et al. | 324/754 |
| 4,116,523 | 9/1978 | Coberly et al. | 439/578 |
| 4,686,463 | 8/1987 | Logan . | |
| 4,697,143 | 9/1987 | Lockwood et al. . | |
| 4,727,319 | 2/1988 | Shahriary . | |
| 4,791,363 | 12/1988 | Logan | 324/754 |
| 4,829,242 | 5/1989 | Carey et al. . | |
| 4,871,964 | 10/1989 | Boll et al. | 324/754 |
| 4,965,514 | 10/1990 | Herrick . | |
| 5,041,782 | 8/1991 | Marzan | 324/754 |

FOREIGN PATENT DOCUMENTS

| | | |
|---|---|---|
| 4206845A | 7/1992 | Japan . |
| 563049A | 3/1993 | Japan . |

*Primary Examiner*—Kenneth A. Wieder
*Assistant Examiner*—Kourosh Cyrus Khosravi
*Attorney, Agent, or Firm*—Kevin B. Jackson

[57] ABSTRACT

An apparatus for probing high frequency electronic devices in wafer form includes a high frequency wafer probe (16, 56) having a conductor (36, 61), a dielectric layer (37, 71, 72), a grounding layer (38, 81, 82, 91), a signal probe needle (39,86), and a pair of ground needles (43, 72, 76) coupled to a substrate (11, 51). A plurality of high frequency wafer probes (16, 56) can be coupled to the substrate (11, 51) to probe high density high frequency electronic devices and to probe high frequency electronic devices having varying bonding pad layouts. The high frequency wafer probe (16, 56) is less sensitive to varying bonding pad height. The apparatus is suitable for probing high frequency electronic devices in a wafer manufacturing environment.

6 Claims, 4 Drawing Sheets

HIGH FREQUENCY WAFER PROBE APPARATUS AND METHOD

BACKGROUND OF THE INVENTION

This invention relates, in general, to devices for testing electronic circuits, and more particularly to wafer type probes for testing high frequency electronic circuits on semiconductive or dielectric substrates.

Wafer probes provide interim electrical contact between testing equipment and the contact structures (bonding pads) of small integrated circuit (IC) devices formed on semiconductor substrates or wafers. By using wafers probes, manufacturer's obtain electrical data from the IC devices prior to separating, bonding, and packaging each IC device on the wafer. This data permits a manufacturer to monitor the manufacturing process, to respond to processing problems, and to make process adjustments before incurring additional manufacturing costs.

A major problem with most existing high frequency (greater than 100 mega-hertz) wafer probes is that they are bulky and very expensive. This has prevented their widespread use in a manufacturing environment. In particular, most existing high frequency wafer probes, such as that shown in U.S. Pat. No. 4,697,143 issued to Lockwood et al., are formed on large mounting blocks that take up significant room on a wafer tester. Because of their size, these wafer probes make it difficult to include several high frequency wafer probes alone or together with DC probes on a tester in order to probe wafers having a high density of bonding pads.

Also, most existing high frequency wafer probes use transmission line assemblies or rigid insulative substrates having conductive transmission lines formed on them to make contact to the IC devices. Because the substrates are rigid, the terminations or tips of the individual transmission lines are fixed or inflexible, making it difficult to probe bonding pads having variable height. In addition, these wafer probes can cost several thousands of dollars. This high cost makes it prohibitive to manufacture different IC device bonding pad layouts because a manufacturer would have to purchase a different high frequency probe for each bonding pad layout. Furthermore, most existing blade style high frequency wafer probes use a microstripline design, which in some application provides inadequate signal isolation.

Thus, there exists a need for a high frequency wafer probe apparatus that permits the use of a plurality of high frequency wafer probes within the wafer probe apparatus, that has probe tips that are less sensitive to variable bonding pad height, and that is cost effective. In addition, there exists a need for a cost effective high frequency stripline blade probe.

SUMMARY OF THE INVENTION

Briefly stated, a high frequency wafer probe apparatus is provided. The apparatus includes a substrate having an opening. The substrate is adapted for holding a plurality of high frequency wafer probes. The apparatus also includes at least one high frequency wafer probe. The high frequency wafer probe comprises a conductor, a dielectric layer substantially covering the conductor, and a grounding layer substantially covering the dielectric layer. The high frequency wafer probe further includes a signal probe needle coupled to the conductor at one end of the probe and a pair of ground needle probes coupled to the grounding layer at the same end. The ground needles are substantially opposite each other and are substantially parallel to each other.

A method for probing high frequency wafers is also provided. A high frequency wafer probe comprising a conductor, a dielectric layer, a grounding layer, a signal probe needle, and a pair of ground needles is coupled to a substrate and the substrate is attached to a wafer testing apparatus. The high frequency wafer probe is connected to a high frequency tester. A wafer having high frequency electronic devices is placed on the wafer testing apparatus. The high frequency wafer probe is brought into contact with a high frequency electronic device and the high frequency electronic device is then tested.

DETAILED DESCRIPTION OF THE DRAWINGS

Generally, the present invention relates to an apparatus for probing high frequency electronic devices in wafer form. In particular, the apparatus is suitable for probing electronic devices at frequencies from about 100 mega-hertz (MHz) to about 10 giga-hertz (GHz). The present invention can be more fully described with reference to FIGS. 1–8.

Figure 1:
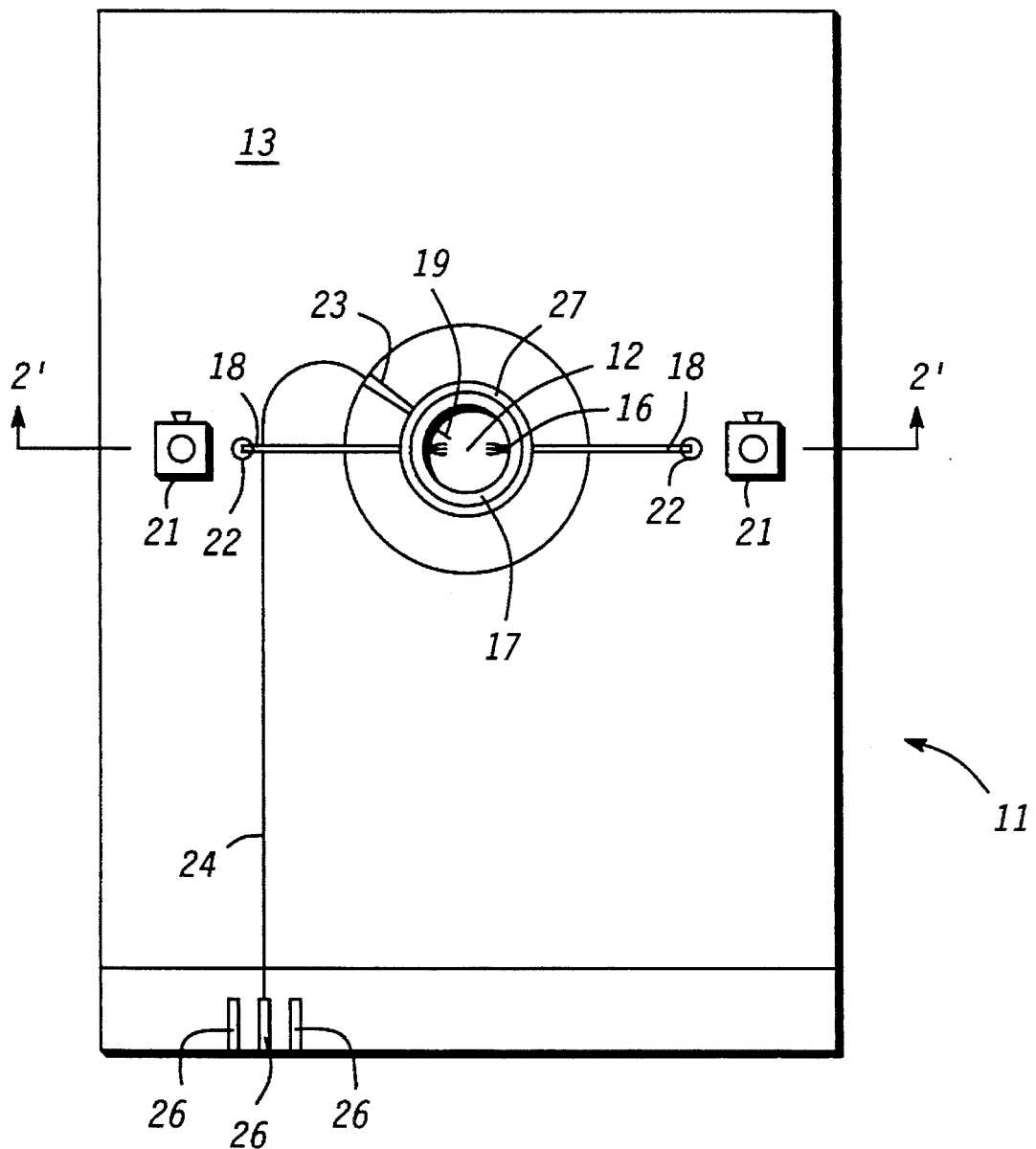
FIG. 1 illustrates a top view of one embodiment of a high frequency wafer probe apparatus according to the present invention.
Figure 2:
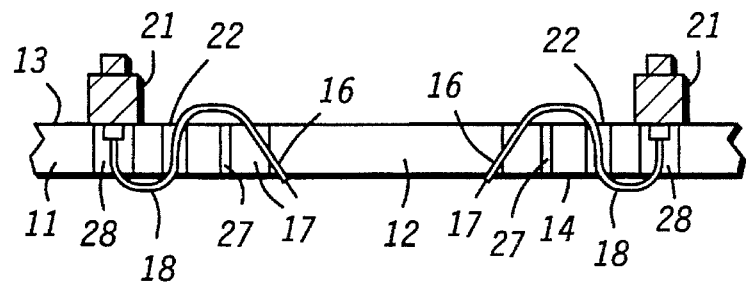
FIG. 2 illustrates a cross-sectional view of the embodiment of FIG. 1 taken along reference line 2'—2' of FIG. 1.

FIG. 1 illustrates a top view of one embodiment of a high frequency wafer probe according to the present invention. Substrate or probe card 11 has an opening 12 that extends from the top surface 13 to a lower surface 14 (shown in FIG. 2). Substrate 11 is made of glass epoxy or polyimide for example. Substrate 11 further includes at least one high frequency wafer probe 16 coupled to substrate 11 so that the probe needles of high frequency wafer probe 16, extend into opening 12 and below lower surface 14 of substrate 11 (shown in FIG. 2). Optionally, substrate 11 also includes one or more DC probe needles 19. Preferably, substrate 11 further includes a support structure or ring 17 within opening 12 for supporting high frequency wafer probe 16. Support structure 17 is coupled to substrate 11 using an adhesive layer 27 such as an epoxy fillet. In a preferred embodiment, high frequency wafer 16 is embedded within support structure 17 as shown in FIG. 2. Support structure 17 comprises an insulating material, preferably a ceramic epoxy.

One end 18 of high frequency wafer probe 16 is adapted for coupling to a high frequency testing apparatus or tester. An example of such a tester is a LTX Synchro HT tester with a RF02 option. Preferably, one end 18 of high frequency wafer probe 16 is coupled to a high frequency connector 21, which is attached to substrate 11 and is designed to connect or couple to the high frequency tester using coaxial cables for example. High frequency connector 21 is conveniently connected to the high frequency tester using coaxial cables for example. Examples of suitable high frequency connectors include SMA, OSSP, OSM, or SMC connectors, which are available from Microwave Associates/Omni-Spectra. Preferably, one end 18 of high frequency wafer probe 16 passes through an opening 22 in substrate 11 and couples to high frequency connector 21 from the lower surface 14 of substrate 11.

In the preferred embodiment, DC probe needle 19 also is embedded in support structure 17. One end of DC probe needle 19 is coupled to a trace or conductive pad 23 formed on substrate 11. A transmission line 24 connects trace 23 to edge connector 26 formed on one end of substrate 11. Edge connector 26 conveniently couples to a wafer probing apparatus such as an Electroglass 2010X in a manner well known to those skilled in the art. Preferably, trace 23, transmission line 24, and edge connector 26 comprise gold and are formed on or within substrate 11 using well known techniques.

FIG. 2 is a cross-sectional view of the embodiment of FIG. 1 taken along reference line 2'—2'. Substrate 11 has opening 12, upper surface 13, and lower surface 14. Preferably, high frequency wafer probe 16 is embedded in support structure 17 through a passage or conduit using techniques well known in the art. Preferably, one end 18 of high frequency wafer probe 16 passes through opening 22 in substrate 11 and connects to high frequency connector 21 through an opening 28 in substrate 11. Optionally, high frequency wafer probe 16 is mounted to the lower surface of support structure 17 and lower surface 14 and couples to high frequency connector 21 through opening 28. Optionally, high frequency wafer probe 16 is coupled to the upper surface of support structure 17 and upper surface 13 and couples to high frequency 21 either from above or below substrate 11. In these optional embodiments, high frequency wafer probe 16 is mounted to support structure 17 and substrate 11 using a ceramic epoxy molding or the like to enclose high frequency wafer probe 16.

Figure 3:
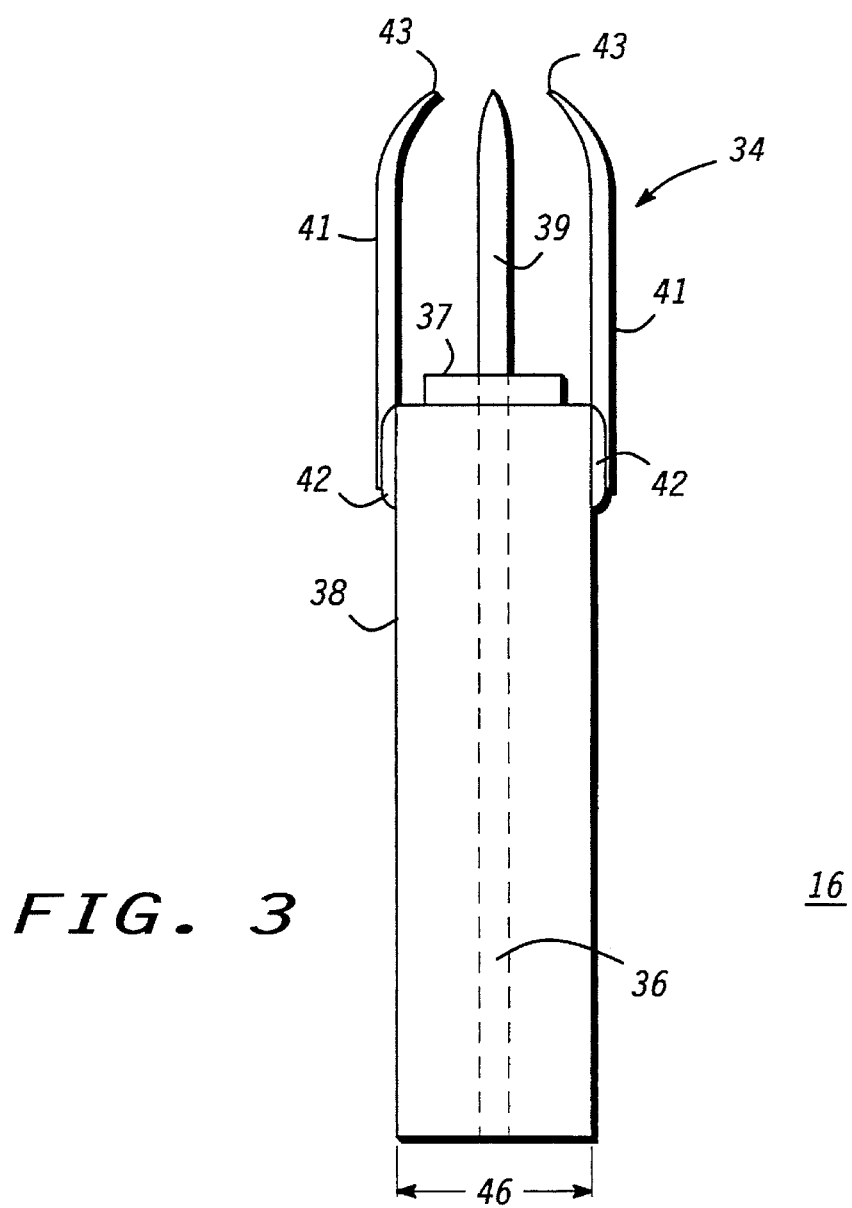
FIG. 3 illustrates a top view of one embodiment of a high frequency wafer probe according to the present invention.

FIG. 3 illustrates a top view of one embodiment of high frequency wafer probe 16 at a probe end 34. High frequency wafer probe 16 comprises a conductor 36, a dielectric layer 37 substantially covering conductor 36, and a grounding layer or jacket 38 substantially covering dielectric layer 37. In this embodiment, conductor 36, dielectric layer 37, and grounding layer 38 form a coaxial probe. Dielectric layer 37 comprises a silicon oxide, a tetrafluoro ethylene resin, alumina, or the like. In a preferred embodiment, dielectric layer 37 comprises a silicon oxide. Preferably, high frequency wafer probe 16 has an outer diameter 46 between approximately 0.45 and 0.80 millimeters (mm).

High frequency wafer probe 16 further comprises a signal probe needle or wire 39 coupled to conductor 36, and a pair of ground probe needles or wires 41 mounted to grounding layer 38 substantially opposite and substantially parallel to each other. Preferably, ground probe needles 41 are substantially parallel to signal probe needle 39 to provide optimum impedance matching. Preferably, signal probe needle 39 and conductor 36 are a single piece of conductive material. Preferably, ground probe needles 41 are mounted to grounding layer 38 using a hard solder such as a silver solder, for example.

When high frequency wafer probe 16 is used to probe wafers have bonding pads comprising gold, signal probe needle 39 and ground probe needles 41 preferably comprise a beryllium-copper alloy. When the bonding pads comprise aluminum, signal probe needle 39 and ground probe needles 41 preferably comprise tungsten. When high frequency wafer probe 16 is used to probe wafers in the frequency range of 100 MHz to approximately 5 GHz, signal probe needle 39 and grounding probe needles 41 have a length of approximately 2.0 to 5.0 mm from the end of grounding layer 38. As the testing frequency increases, the length of signal probe needle 39 and ground probe needles 41 decreases. In the most preferred embodiment, probe tips 43 of ground probes 41 taper inward towards signal probe 39 to better align with typical ground-signal-ground bonding pad layout schemes.

Because of its small size and lower cost compared to conventional block style high frequency wafer probes, a manufacturer can incorporate a plurality of high frequency wafer probes 16 within a substrate 11. This allows for the probing of high density IC devices. Also, a manufacturer can adjust the location of high frequency wafer probe 16 within opening 12 of substrate 11 when assembling the components on substrate 11 to allow for cost effective probing of different bonding pad layouts. In addition, because high frequency wafer probe 16 utilizes probe needles, it is less susceptible to probing problems associated with varying bonding pad height. Probe needles are more flexible than rigid transmission line assemblies and can be adjusted to compensate for varying bonding pad height. The above benefits enhance manufacturing throughput.

Figure 4:
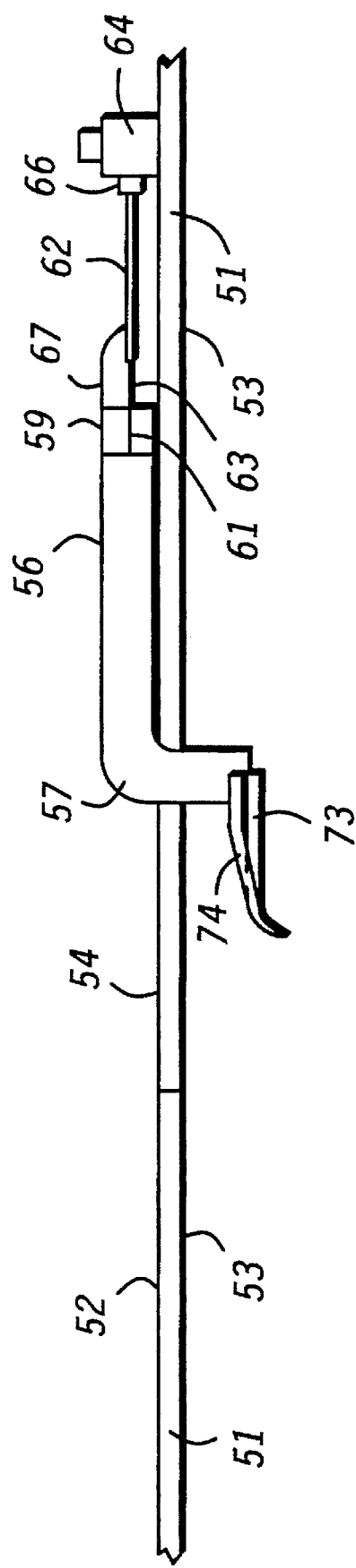
FIG. 4 illustrates a cross-sectional view of another embodiment of a high frequency wafer probe apparatus according to the present invention.
Figure 5:
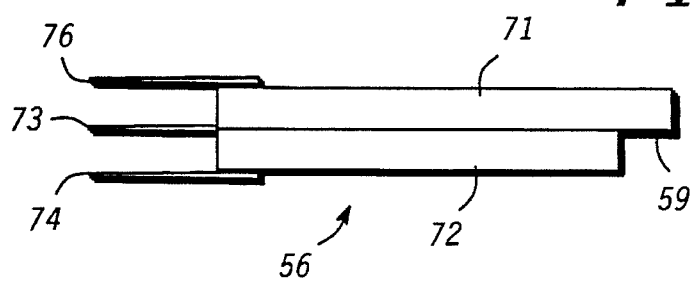
FIG. 5 illustrates a top view of a portion of the high frequency wafer probe of FIG. 4.

FIG. 4 illustrates a cross-sectional view of another embodiment of a high frequency wafer probe apparatus according to the present invention. Substrate or probe card 51 has an upper surface 52, a lower surface 53, and an opening 54. At least one high frequency wafer probe 56 is coupled to substrate 51 so that signal probe needle 73 and ground probe needles 74 and 76 (ground probe needle 76 is shown in FIG. 5) coupled to high frequency wafer probe 56 extend into opening 54 and below lower surface 53. Preferably, one end 57 of high frequency wafer probe 56 extends downward into opening 54 and high frequency wafer probe 56 is coupled to upper surface 52 of substrate 51. High frequency wafer probe 56 is coupled to substrate 51 using a ceramic epoxy, for example. Optionally, high frequency wafer probe 56 has only signal probe needle 73 and no ground probe needles or high frequency wafer probe 56 has signal probe needle 73 and only one ground probe needle 74 or 76.

An opposite end of high frequency wafer probe 56 is adapted for coupling to a high frequency test apparatus or tester. In a preferred embodiment, one side or portion of high frequency wafer probe 56 is longer than the other side to form coupling portion 59 and to expose a conductive strip or conductor 61. A coaxial cable 62 having a center conductive wire 63 is coupled to conductive strip 61 at one end and coupled to a high frequency connector 64 at an opposite end using interconnect 66 for example. An example of such an interconnect is an OSSP or SMA interconnect available from Microwave Associates/Omni-Spectra.

Center conductor wire 63 preferably is coupled to conductive strip 61 using a solder such as a lead-tin-silver solder. The outer jacket of coaxial cable 62 is coupled to a grounding plane layer 91 (shown in FIG. 8) formed on the outer surface of high frequency wafer probe 56 using a connective Conductive strip or hood 67. Preferably, conductive strip 67 at least partially shields center conductor wire 63. Connective conductive strip 67 preferably comprises a tin-plated copper foil and is attached to the outer Jacket of coaxial cable 62 and grounding plane layer 91 using a lead-tin-silver solder for example.

FIG. 5 illustrates a top view of high frequency wafer probe 56. High frequency wafer probe 56 comprises a left dielectric portion or insulating blade 71, right dielectric portion or insulating blade 72, signal probe needle 73, and a pair of ground probe needles 74 and 76. In a preferred embodiment, ground probe needles 74 and 76 are substantially parallel to each other. Also, it is preferred that left dielectric portion 71 extends beyond right dielectric portion to form coupling portion 59, which is adapted for coupling to a high frequency tester. Left dielectric portion 71 and right dielectric portion 72 comprise an insulating material such as a ceramic and are coupled together using a ceramic epoxy for example.

Figure 6:
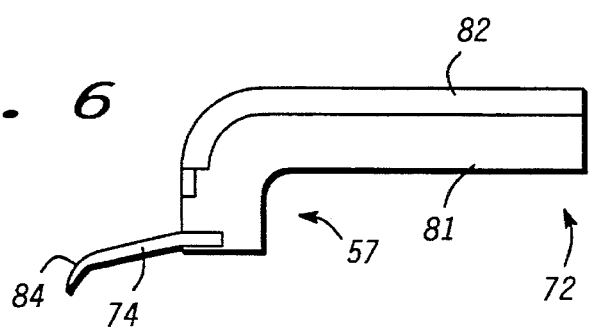
FIG. 6 illustrates a view of an outside surface of a right portion of the probe of FIG. 4.

FIG. 6 illustrates a side view of an outside surface of right dielectric portion 72. Preferably, right dielectric portion 72 has downwardly extending portion 57 to better position the probe needles below lower surface 53 of substrate 51 as shown in FIG. 4. A ground plane layer 81 is formed on the outside surface of right dielectric portion 72. Ground plane layer 81 covers at least a portion of right dielectric portion 72 and preferably extends from one end of right dielectric portion 72 to an opposite end. Ground plane layer 81 preferably comprises gold and is formed on the outside surface of right dielectric portion 72 using well known techniques.

Ground probe 74 is coupled to ground plane layer 81 using a solder such as a silver solder. Preferably, tip 84 of ground probe 74 extends downward to enhance contact to a bonding pad under test, A conductive layer or film 82 couples ground plane layer 81 on right dielectric portion 72 to ground plane layer 91 (shown in FIG. 8) formed on the outside surface of left dielectric portion 71. Preferably, conductive layer 82 comprises a copper foil.

Figure 7:
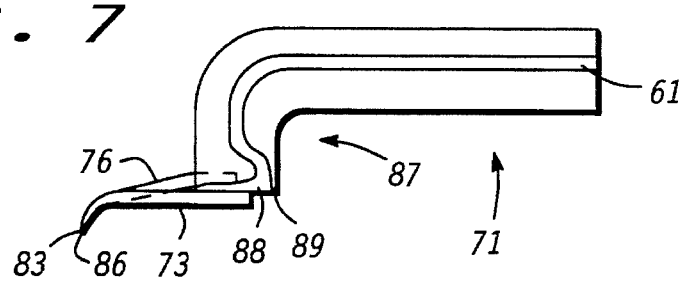
FIG. 7 illustrates a view of an inside surface of a left portion of the probe of FIG. 4.

FIG. 7 illustrates a side view of an inside surface of left dielectric portion 71. Preferably, left dielectric portion 71 has downwardly extending portion 87 to better position the probe needles below lower surface 53 of substrate 51 as shown in FIG. 4. Conductive strip 61 is formed on the inside surface of left dielectric portion 71 and extends from one end to an opposite end of left dielectric portion 71. Preferably, conductive strip 61 extends to cover a portion 88 of end face 89 of left dielectric portion 71 to provide a coupling pad for signal probe needle 73. The portion of conductive strip 61 on end face 89 must not be in electrical contact with ground plane layer 91.

Optionally, when high frequency wafer probe 56 does not have downwardly extending portions 57 and 87 and is substantially straight, conductive strip 61 extends to cover a portion of the lower edge of left dielectric portion 71. Conductive strip 61 preferably comprises gold and is formed on the inside surface of left dielectric portion 71 using well known techniques.

Signal probe needle 73 is coupled to conductive strip 61 preferably along lower edge 89 of left dielectric portion 71 using a solder such as silver solder. Ground probe needle 76 is coupled to ground plane layer 91 on the outside surface of left dielectric portion 71 using a solder such as silver solder. Preferably, tip 83 of signal probe needle 73 and tip 86 of ground probe needle 76 extend downward to enhance contact to a bonding pad under test. Preferably, ground probe needles 74 and 76 extend to become substantially parallel to signal probe needle 73 near tip ends 83, 84, and 86 so that tip ends 83, 84, and 86 terminate in a common plane.

Figure 8:
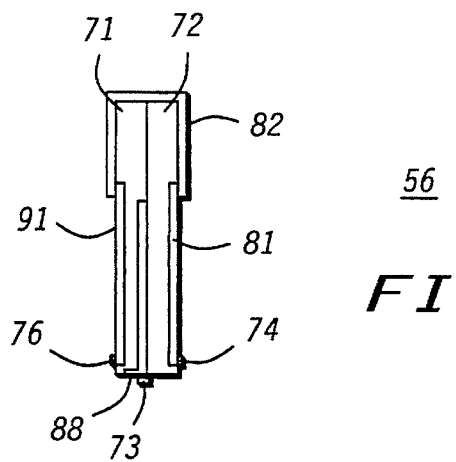
FIG. 8 illustrates a front view of the probe of FIG. 4.

FIG. 8 illustrates a front view of high frequency wafer probe 56 and a portion of its elements shown in FIGS. 5-7. Preferably, ground probe needle 73 is substantially centrally located between ground signal probe needles 74 and 76 as shown in FIG. 8.

Together, left dielectric portion 71 and right dielectric portion 72 form a dielectric layer that substantially covers conductive strip or conductor 61. Ground plane layer 81 and ground plane layer 91 together with conductive layer 82 form a grounding layer that substantially covers the dielectric layer. High frequency wafer probe 56 forms a cost effective stripline probe having a small size or footprint. Because of its size and cost effectiveness, a plurality of high frequency wafer probes 56 can be incorporated on substrate 51 to provide high bonding pad density probing capability. In addition, the stripline design provides a greater signal isolation thus reducing interference with other probe devices compared to microstripline designs.

DC probe needles can be incorporated with the plurality of high frequency wafer probes 56 on substrate 51 to greatly increase wafer probing flexibility. In addition, because high frequency wafer probe 56 utilizes probe needles, it is less susceptible to probing problems associated with varying bonding pad height. Probe needles are more flexible than rigid transmission line assemblies and can be adjusted to compensate for varying bonding pad height. These benefits enhance manufacturing flexibility and productivity.

To probe a semiconductor or dielectric wafer having electronic or IC devices according to the present invention, a semiconductor or dielectric wafer having electronic devices is placed on a wafer holder or vacuum chuck of a wafer testing apparatus. An example of such a testing apparatus is an Electroglas 2010X. Next substrate 11 or 51 having at least one high frequency wafer probe 16 or 56 is connected to the wafer testing apparatus. A high frequency tester such as a LTX Synchro HT with a RF02 option is then connected to high frequency probe 16 or 51, preferably using high frequency connector 21 or 64 on substrate 11 or 51. Connecting cables such as QMI flexible or semi-rigid cables are used to couple the high frequency tester to high frequency connector 21 or 64 for example. Optionally, DC probe needles are coupled to substrate 11 or 51 for performing DC testing. A DC tester such as a Hewlett-Packard 4142 is coupled to the wafer testing apparatus to provide DC testing capability.

Next, a wafer test routine is loaded into the high frequency tester. In addition, a DC test routine is loaded into the DC tester if DC testing is used. Substrate 11 or 51 having at least one high frequency wafer probe 16 or 56 is then aligned to the wafer. Next signal probe needle 39 or 73 and ground probe needles 41 or 74 and 76 are brought into contact with corresponding bonding pads on the wafer.

After contacting the corresponding bonding pads, the electronic device is tested and its electrical characteristics measured by the high frequency tester. After an electronic device is tested, substrate 11 or 51 is raised and placed over the next electronic device to be tested. Contact to the next device is then made and the next electronic device is tested and its electrical characteristics measured. The process is repeated until the desired number of electronic devices is tested. When the electronic device to be tested has a high density of bonding pads to be tested, additional high frequency probes 16 or 56 are coupled to substrate 11 or 51 to provide a cost effective method for probing high density high frequency electronic devices.

By now it should be appreciated that there has been provided a high frequency wafer probe apparatus and method for probing high frequency electronic devices. Because of their small size and cost effectiveness compared to conventional high frequency wafer probes, the high frequency wafer probes according to the present invention permit a manufacturer to use a plurality of high frequency probes on a substrate thus allowing for the probing of high density high frequency electronic devices. Also, the high frequency wafer probe apparatus according to the present invention permits a manufacturer to include DC probing capability thus increasing manufacturing flexibility and productivity.

The high frequency wafer probe apparatus according to the present invention is less susceptible to bonding pad height variation because the apparatus utilizes a probe needle configuration. In addition, because the high frequency wafer probe apparatus according to the present invention is cost effective, a manufacturer can design varying bonding pad layouts thus providing for an increase in IC device design flexibility.

I claim:

1. A high frequency wafer probe apparatus comprising:

a substrate having a top surface, a bottom surface, and an opening extending through the substrate from the top surface to the bottom surface;

an insulating ring disposed within the opening; and a high frequency coaxial wafer probe having a first end and a second end, a conductor extending from the first end to the second end, a dielectric layer surrounding the conductor, a grounding layer surrounding the dielectric layer, and a pair of ground probe needles coupled to the grounding layer opposite each other, wherein the conductor extends beyond the dielectric layer and the grounding layer at the first end to form a signal probe needle; and wherein the pair of ground probe needles are adjacent the signal probe needle, and wherein the high frequency coaxial wafer probe is embedded in the insulating ring such that the signal probe needle and the pair of ground probe needles extend below the bottom surface of the substrate, and wherein the second end of the high frequency coaxial wafer probe is adapted for coupling to a high frequency tester.

2. The apparatus of claim 1 wherein the pair of ground probe needles are substantially parallel to the signal probe needle.

3. The apparatus of claim 1 further comprising a high frequency connector coupled to the substrate for connecting the second end of the high frequency coaxial wafer probe to the high frequency tester.

4. The apparatus of claim 1 wherein the insulating ring comprises a ceramic.

5. The apparatus of claim 1 wherein the dielectric layer comprises a silicon oxide, and wherein the high frequency coaxial wafer probe has an outer diameter in a range from approximately 0.45 to 0.80 mm.

6. The apparatus of claim 1 wherein the pair of ground probe needles have probe tips that taper inward towards the signal probe needle.

\* \* \* \* \*